United States Patent [19]
Lee et al.

[11] Patent Number: 6,137,431
[45] Date of Patent: Oct. 24, 2000

[54] OVERSAMPLED PIPELINE A/D CONVERTER WITH MISMATCH SHAPING

[75] Inventors: Hae-Seung Lee, Bedford; Aimon Shabra, Cambridge, both of Mass.

[73] Assignee: Massachusetts Institute of Technology, Cambridge, Mass.

[21] Appl. No.: 09/248,154

[22] Filed: Feb. 9, 1999

[51] Int. Cl.$^7$ ..................................................... H03M 1/00
[52] U.S. Cl. ........................... 341/161; 341/163; 341/143
[58] Field of Search ................................... 341/161, 162, 341/172, 143, 163

[56] References Cited

U.S. PATENT DOCUMENTS

| | | |
|---|---|---|
| 4,994,804 | 2/1991 | Sakaguchi et al. .................. 341/143 |
| 4,994,805 | 2/1991 | Dedic et al. ......................... 341/143 |
| 5,416,485 | 5/1995 | Lee . | 
| 5,459,464 | 10/1995 | Bénéteau et al. ..................... 341/143 |
| 5,499,027 | 3/1996 | Karanicolas et al. ................ 341/162 |
| 5,675,334 | 10/1997 | McCartney ........................... 341/118 |

*Primary Examiner*—Howard L. Williams
*Attorney, Agent, or Firm*—Samuels, Gauthier & Stevens, LLP

[57] ABSTRACT

An analog-to-digital converter including an input that samples an analog input signal; circuitry for multiplying the sampled analog input signal by a sequence including –1 and 1; a conversion unit which converts the analog input signal into a monotonic digital output signal; and circuitry for multiplying the digital output signal by the sequence of –1 and 1 in phase with the first means to produce a mismatch shaped digital output signal. In another embodiment of the invention there is provided a method of analog-to-digital including sampling phases of an analog input signal; multiplying the sampled phases of the analog input signal by a sequence including –1 and 1; converting the analog input signal into a monotonic digital output signal; and multiplying in phase the digital output signal by the sequence of –1 and 1 in phase to produce a mismatch shaped digital output signal.

20 Claims, 5 Drawing Sheets

OVERSAMPLED PIPELINE A/D CONVERTER WITH MISMATCH SHAPING

BACKGROUND OF THE INVENTION

The invention relates to the field of oversampled pipeline A?D converters with mismatch shaping.

In recent years, delta-sigma modulators have become very popular as analog-to-digital conversion circuits. The advantages of delta-sigma A/D converters compared with conventional A/D converters are: 1) shaping of quantization noise thereby reducing in-band quantization noise; 2) ease of anti-aliasing due to inherent oversampling; 3) tolerance to component mismatches.

In delta-sigma converters employing a single loop and 1-bit feedback, the converter is inherently linear, and hence does not require good component matching. However, such converters generally require a large oversampling ratio in order to achieve a high signal-to-noise ratio. The reason for this is, first, the quantization noise of the resulting converter is directly proportional to the quantization noise of the D/A converter in the feedback path. The 1-bit D/A converter in the feedback introduces large quantization noise. Second, the order of the loop has a diminishing effect on the signal-to-noise ratio for the loop to remain stable at high order.

Cascaded or MASH structure was developed to circumvent the instability of high-order delta-sigma converters, thus increasing the signal-to-noise ratio at a given oversampling ratio. Unfortunately, the MASH is much less tolerant to component mismatches, and moreover, is prone to limit-cycle tones. This makes MASH unsuitable for applications where low oversampling ratio is desired. Another attempt for increasing the signal-to-noise ratio of delta-sigma converters is to increase the number of bits in the feedback D/A converter. An unfortunate consequence of multi-bit feedback is that the D/A converter must now be accurate to the final resolution of the delta-sigma converter. For example, in a delta-sigma converter with a target SNDR of 98 dB (16 bits), the D/A converter in the feedback path must be accurate to 16 bits despite the fact that the D/A converter may have only 2 bit resolution. A number of techniques have been developed to overcome the accuracy problems in the multi-bit feedback A/D converters. They include self-calibration, dynamic component matching, and mismatch shaping.

On the contrary, pipeline converters have been traditionally applied to Nyquist-rate sampling. Although pipeline A/D converters are relatively simple and power efficient, component mismatches limit the accuracy to about 10 bits. Numerous techniques that include self-calibration, error averaging, ratio-independent, and reference refreshing methods have been devised to remove errors due to component mismatches. A technique applicable only to cyclic A/D converter has also been devised. Except for self-calibration techniques, all techniques take up extra cycles of the valuable conversion time, reducing the throughput of the converter significantly, and the added complexity often increase the power consumption considerably.

Self-calibration techniques, on the other hand, remove component mismatches without increasing conversion time. Depending on a particular self-calibration technique, power consumption can be comparable to standard pipeline converters or can be substantially increased. The drawback of self-calibration is the additional complexity and the necessity of the calibration period during which the converter is inoperable or has lower accuracy. A recently reported pipeline converter using commutative feedback capacitors does not require self-calibration, neither increases conversion time nor adds more power consumption. Although this technique offers superior differential linearity, the integral linearity still depends on capacitor matching. Therefore, this technique is suitable for applications in which the integral linearity is less important than differential linearity.

In comparing delta-sigma converters and pipeline converters for wide-band signals, for example, 50–100 MHz IF for spread-spectrum receivers, a few important attributes are recognized. Due to the wide bandwidth of the input signal and limited circuit speed, delta-sigma converters afford only low oversampling ratios, which makes high-resolution conversion extremely difficult. The low oversampling ratio generally nullifies the primary advantage of delta-sigma converters; the tolerance to component mismatches.

In this regard, remaining advantages of delta-sigma converters over pipeline converters now only include ease of anti-alias filtering and low quantization noise. It must be noted that the ease of anti-aliasing is not inherent to delta-sigma modulation. Rather, it is associated with oversampling. Therefore, pipeline converters can experience the same benefit of easy anti-aliasing simply operating the converter at higher sampling rate than the Nyquist rate, i.e., oversampling. As for quantization noise in pipeline converters, the quantization noise can be made smaller by adding more stages at the end of the pipeline. Since the last stages of the pipeline do not contribute much thermal noise, they can be made extremely small and low power. Therefore, the quantization noise itself can be made arbitrarily small with negligible increase of area and power. Certainly, doing so will not improve the accuracy or thermal noise. However, it is no different in delta-sigma converters with low oversampling ratio.

Based on the above observation, it can be concluded that delta-sigma converters do not possess any fundamental advantage over pipeline converters for wide band applications that necessitates low oversampling ratios. As a practical matter, at the input frequencies over 50 MHz, it would be extremely difficult to achieve oversampling ratio greater than 8 with final accuracy over 12 bits with present technologies. At this low oversampling ratio, not only the benefits of delta-sigma modulation disappears, but more importantly many delta-sigma converters are incapable of providing good enough performance. One exception is presented where a 12-bit pipeline A/D converter is employed in the back-end of a delta-sigma converter with truncated feedback. This converter reportedly achieved 16 bit SNDR with the oversampling ratio of 8. A possibly more efficient approach would be to oversample a standard pipeline converter, and shape the mismatch out of band which will be removed by a subsequent digital filter. Since no attempt is made to shape the quantization noise, there is none of the concerns associated with delta-sigma converters with a low oversampling ratio.

SUMMARY OF THE INVENTION

According to the present invention there is provided an analog-to-digital converter including an input that samples an analog input signal; first means for multiplying the sampled analog input signal by a sequence including −1 and 1; a conversion unit which converts the analog input signal into a monotonic digital output signal; and second means for multiplying the digital output signal by the sequence of −1 and 1 in phase with the first means to produce a mismatch shaped digital output signal.

In another embodiment of the invention there is provided a method of analog-to-digital conversion including sampling phases of an analog input signal; multiplying the sampled analog input signal by a sequence including −1 and 1; converting the analog input signal into a monotonic digital output signal; and multiplying in phase the digital output signal by the sequence of −1 and 1 in phase to produce a mismatch shaped digital output signal.

DETAILED DESCRIPTION OF THE INVENTION

Figure 1:
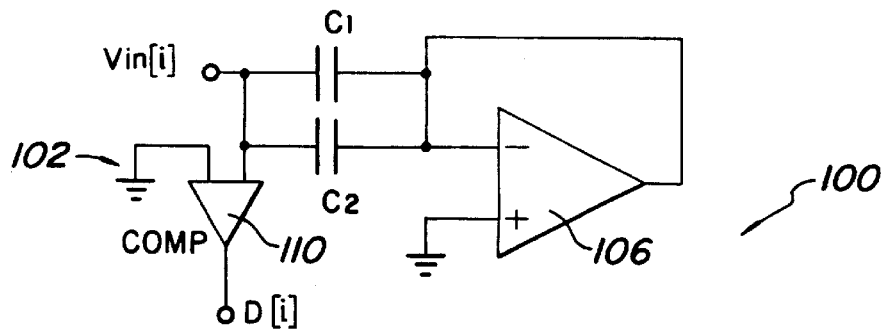
FIG. 1 is a functional block diagram of a 1-bit/stage A/D converter.
Figure 1:
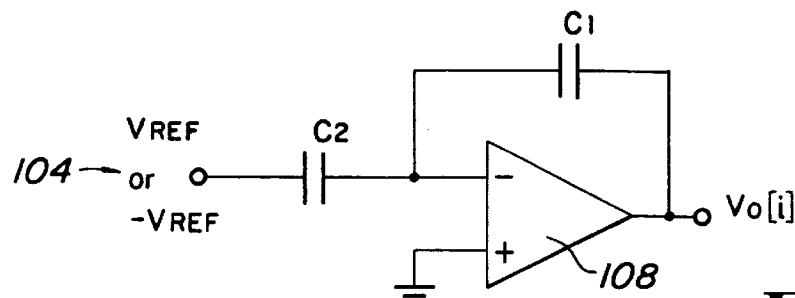

In order to understand the mismatch shaping of pipeline converters, consider the simple example of a 1-bit/stage pipeline A/D converter 100, the i-th stage of which is shown in functional block diagram form in FIG. 1. $C_1$ and $C_2$ are nominally identical. Each converter operates in two phases 102 and 104, including operational amplifiers 106 and 108, respectively. During the sampling phase 102, both $C_1$ and $C_2$ sample the input voltage $V_{in}[i]$ to the stage. At the same time, a comparator 110 determines whether the input voltage $V_{in}[i]$ is above or below 0V.

If $V_{in}[i]>0$, then the bit $D[i]=1$, otherwise $D[i]=0$. During the second phase 104, which is the amplifying phase, $C_1$ is connected to the output of the operational amplifier 108, and $C_2$ is connected to either a reference voltage $V_{REF}$ or $-V_{REF}$ depending on the bit value $D[i]$. If $D[i]=1$, $C_2$ is connected to $V_{REF}$, resulting in an output voltage $V_o[i]=2V_{in}[i]-V_{REF}$. Otherwise, $C_2$ is connected to $-V_{REF}$, giving an output voltage $V_o[i]=2V_{in}[i]+V_{REF}$. In other terms, $V_o[i]=2V_{in}[i]+(-1)^{D[i]}V_{REF}$.

N similar stages can be cascaded to construct an N-bit pipeline A/D converter. In practice, a number of sources introduce errors in the conversion. They include the charge injection from the sampling switch, the comparator offset, and the mismatch between $C_1$ and $C_2$. It is assumed here that the open-loop gain of the operational amplifier 108 is sufficiently large. By employing the standard digital error correction, the comparator offset can be easily compensated. The effect of charge injection can be substantially reduced by a fully differential configuration. The residual charge injection causes only a benign input referred offset of the converter.

Capacitor mismatch, however, is much more difficult to remove. Assuming the definitions $C=(C_1+C_2)/2$ and $\Delta=C_1-C_2$, then $C_1=C(1+\Delta/2)$ and $C_2=C(1-\Delta/2)$. The resulting output voltage $V_o[i]$ can be shown to be:

$$V_o[i]=2(1+\Delta/2)V_{in}[i]+(-1)^{D[i]}(1-\Delta)V_{REF}$$

Figure 2A:
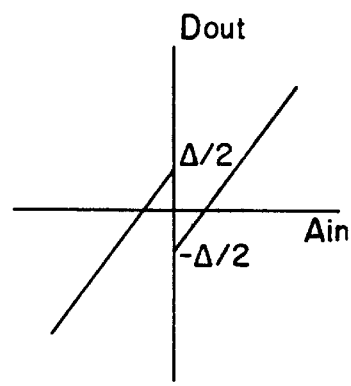
FIG. 2 are graphs of converter characteristics of first stage capacitor mismatch.
Figure 2B:
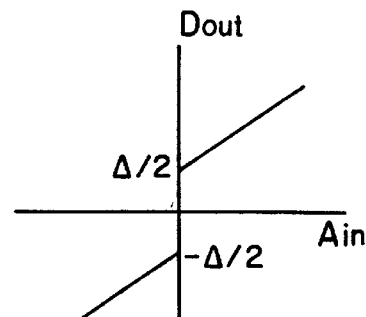
Figure 2C:
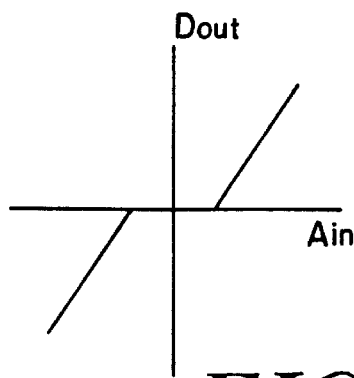

In order to consider the effect of the capacitor mismatch on the converter characteristic, assume that only the first stage of the pipeline has the capacitor mismatch $\Delta$, and all subsequent stages have perfect matching. The resulting converter characteristic is illustrated in the graphs of FIGS. 2A–2C. The non-monotonicity near the center of the characteristic for $\Delta<0$ arises if digital error correction is employed in the subsequent stages. Otherwise, a "wide code" will result as shown in FIG. 2C.

Figure 3:
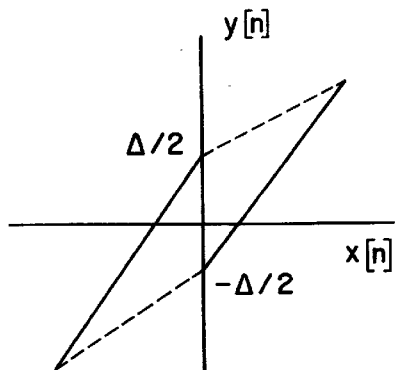
FIG. 3 is a graph of a converter characteristic that alternates at the sampling frequency between that in FIG. 2A and FIG. 2B.

As rudimentary mismatch shaping, one can exchange the roles of $C_1$ and $C_2$ at the sampling rate. In other words, for one sample of the input, $C_1$ and $C_2$ are operated as shown in FIG. 1. For the next sample, $C_2$ is employed as the feedback capacitor while $C_1$ is connected to $V_{REF}$ or $-V_{REF}$. The converter characteristic will alternate at the sampling frequency between that in FIG. 2A and FIG. 2B as diagrammatically shown in the graph of FIG. 3.

The average converter characteristic will be very close to the ideal one and the error is modulated to half the sampling rate. If the analog input is DC, the error is indeed modulated to half the sampling rate, which can be removed by a digital low pass filter. Since the mismatch shaping is to be applied to oversampled converters, the input does not change very rapidly from one sample to another, and it can be deduced that the error will be pushed out to high frequencies. However, a close examination of the converter characteristic reveals the problem with such a method. Suppose the input is changing slowly near 0, and the first sample was just below 0 and the next just above 0. In both cases, if the role of $C_1$ and $C_2$ are swapped between the two samples, both samples will have $+\Delta$ as their error which add up rather than cancel each other. Although this error happens at the particular point of the converter input and will be averaged out over many samples, the reduction of the error by averaging will be small if the oversampling ratio is small.

Figure 4:
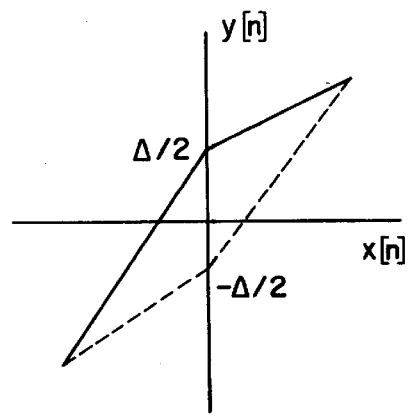
FIG. 4 is a graph of a commutative feedback capacitor scheme (CFCS) converter characteristic in accordance with the invention.

A better approach is to start with converter characteristic as shown in the graph of FIG. 4. The converter characteristic is swapped between the solid line and the dotted line at the sampling rate as before. In this case, if the input is changing slowly near 0, the errors in two successive samples just below and above 0 now cancel each other. The converter characteristic in FIG. 4 can be obtained by the commutative feedback capacitor scheme (CFCS) as described in U.S. Pat. No. 5,416,485, incorporated herein by reference. The CFCS is implemented by slightly altering the basic operation of the standard converter shown in FIG. 1.

Figure 5:
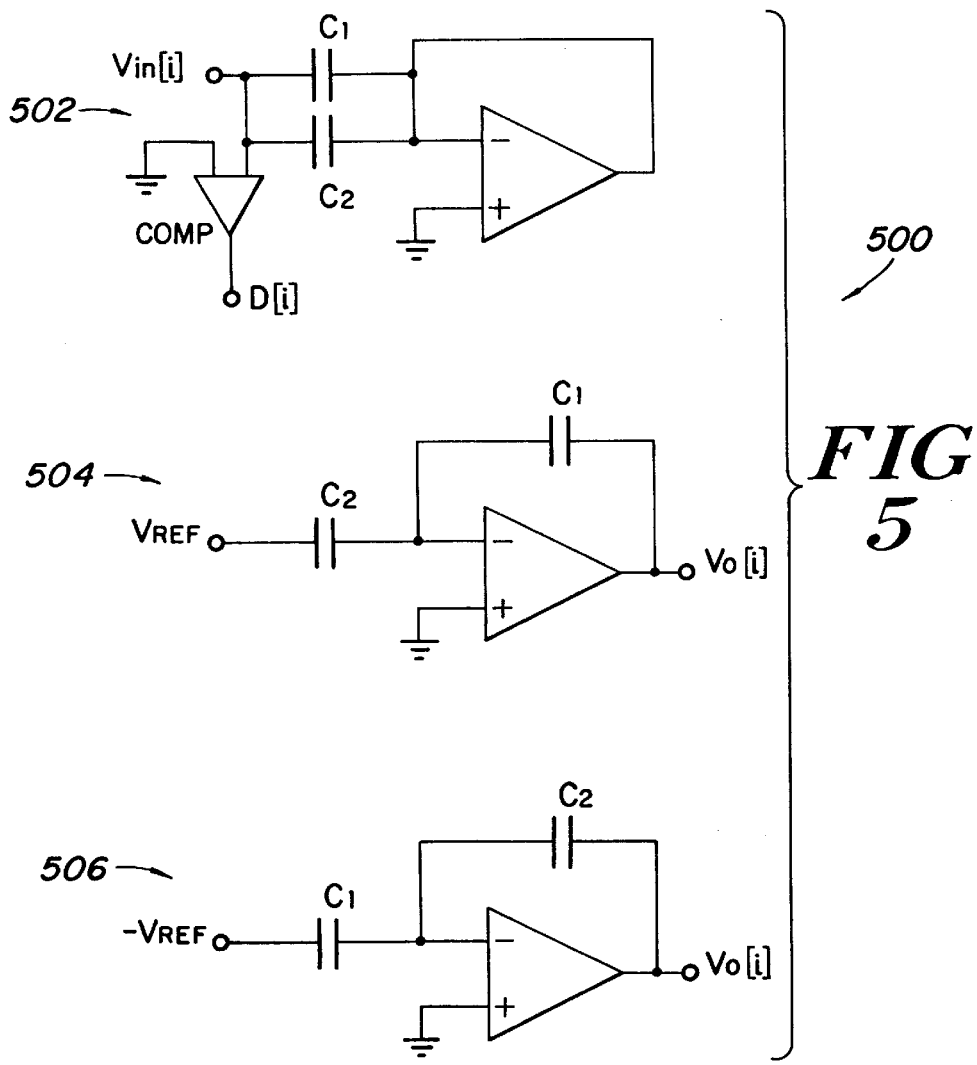
FIG. 5 is a functional block diagram of a CFCS 1-bit/stage pipeline A/D converter in accordance with the invention.

Accordingly, FIG. 5 is a functional block diagram of a CFCS 1-bit/stage pipeline A/D converter 500. The converter includes a sampling phase 502 and two amplifying stages 504 and 506. Instead of designating $C_1$ as the feedback capacitor, either $C_1$ or $C_2$ is selected as the feedback capacitor, while the other capacitor is connected to $V_{REF}$ or $-V_{REF}$ depending on the bit value $D[i]$. The sampling phase 502 is unchanged. For $D[i]=1$, the operation is the same as in FIG. 1, with $C_1$ being selected as the feedback capacitor. For $D[i]=0$, however, $C_2$ is selected as the feedback capacitor as shown in phase 506. This operation gives the characteristic of FIG. 4 despite capacitor mismatches. The dotted characteristic in FIG. 4 with the errors in the opposite direction can be obtained by reversing the roles of $C_1$ and $C_2$. For D[i]=1, $C_2$ is selected as the feedback capacitor, and for D[i]=0, $C_1$ is selected as the feedback capacitor. Alternating between these two characteristics at the sampling rate pushes the mismatch error to high frequencies.

Although the discussion presented assumed the error was only in the first stage, the analysis can be easily extended to errors in other stages. It can be shown that exploiting CFCS and swapping the roles of $C_1$ and $C_2$ in each stage shapes all mismatch components to out of band that can be removed by a digital filter.

Figure 6:
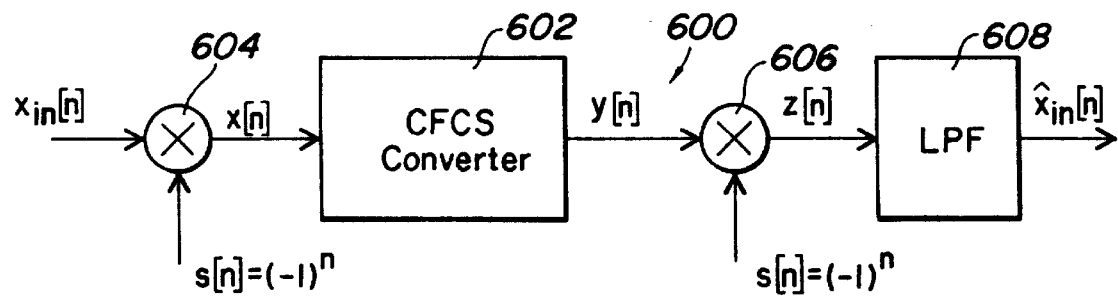
FIG. 6 a block diagram of a converter circuit with a CFCS monotonic pipeline A/D converter.

An exemplary implementation of the previous concept is shown in FIG. 6, which illustrates a converter circuit 600. The circuit 600 includes at its core a commutative feedback capacitor scheme monotonic pipeline A/D converter 602. The input to the CFCS converter is multiplied by −1 via a multiplier 604 at alternating sampling phases, and its digital output is also multiplied by −1 via a multiplier 606 during those phases as shown in FIG. 6. The output is then filtered with a LPF 608. Accordingly, the converter characteristics simply alternate between the characteristics in FIG. 4, at a rate equal to the sampling frequency, and mismatch shaping is realized. It should be noted that a CFCS core is essential for this scheme to work. If a non-CFCS converter is used, then the input will pass through the same characteristic during all sampling phases and the error is not pushed to higher frequencies.

In a fully differential implementation multiplying the input with s[n] can be realized by swapping the polarity of the input applied to the CFCS stage, an operation which has a very simple circuit realization. Moreover, the multiplication in the digital domain can also be realized very simply by inverting the digital word bits when multiplying by −1. Of course when multiplying by 1 nothing is changed. Therefore, the circuit implementation of this concept only requires a digital low-pass filter to remove high frequency errors.

To gain further insights on how to improve the performance of the A/D converter of the invention, one needs to analyze the implementation in FIG. 6. The CFCS converter characteristic can be expressed as:

$$y[n]=x[n]+q[n]+g(x[n]),$$

where x[n] and y[n] are the input and output of the CFCS stage. The quantity q[n] is the quantization noise of the converter. The function g(.) is nonlinear and is a result of capacitor mismatch in the stages of the pipeline. The function g(.) does not contain any large discontinuities which would result in a differential nonlinearity in the converter. In addition, g(.) is an even function.

The foregoing features are utilized in realizing mismatch shaping in the following manner. The input of the converter $x_{in}[n]$ is multiplied by a sequence $s[n]=(-1)^n$, resulting in $x[n]=x_{in}[n](-1)^n$. x[n] is digitized by the CFCS core resulting in:

$$y[n]=(-1)^n x_{in}[n]+q[n]+g(x_{in}[n]).$$

This result can be obtained by utilizing the even nature of the function g(.). Finally, the output of the CFCS core is multiplied by the same sequence s[n] giving:

$$z[n]=x_{in}[n]+(-1)^n q[n]+(-1)^n g(x_{in}[n]).$$

The first term in z[n] is the desired signal. The second term is the quantization noise modulated to half the sampling frequency $\pi$, an operation that does not change its white nature. The final term is the distortion components modulated to $\pi$. Since the input is oversampled, only the high order distortion components alias with the input signal. These higher order components have a magnitude that is much smaller than that of the lower order distortion components, which results in a significant improvement in SNDR, if z[n] is digitally low pass filtered.

Modulating the distortion components $g(x_{in}[n])$ to half the sampling frequency does not eliminate the discrete tones that fall in-band, although their amplitude is diminished. To whiten the in-band noise floor a random swapping sequence can be used. The power spectral density (PSD) of the sequence must satisfy a few requirements, in order to be effective in eliminating tones and to achieve mismatch shaping. Since the swapping sequence is multiplied by the distortion components due to the converter non-linearity, as was shown in the last equation, it is desired to have a sequence with a single PSD lobe at half the sampling frequency.

Figure 7:
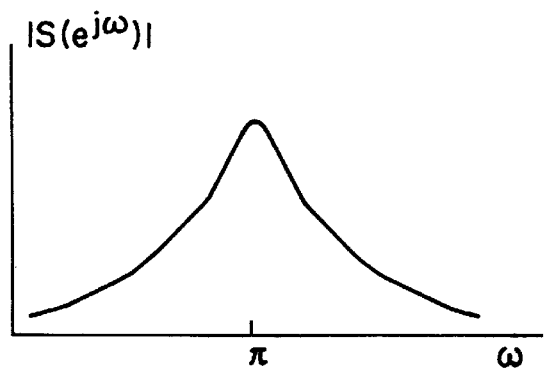
FIG. 7 is a graph of the power spectral density (PSD) of an exemplary swapping sequence.

In addition, the PSD lobe should be wide enough to spread the distortion tones, but not too broad, in order to prevent a rise in the in-band noise floor. A candidate sequence with the desired PSD is:

$$s[n]=(-1)^{n+P[n]},$$

where P[n] is a discrete-time Poisson counting process (a process that increments with Poisson arrival). The PSD of this process decays as one moves away from half the sampling frequency as is illustrated in FIG. 7. FIG. 7 is a graph of a PSD of an exemplary swapping sequence. The rate of decay can be increased by reducing the rate of the Poisson process arrivals.

Figure 8A:
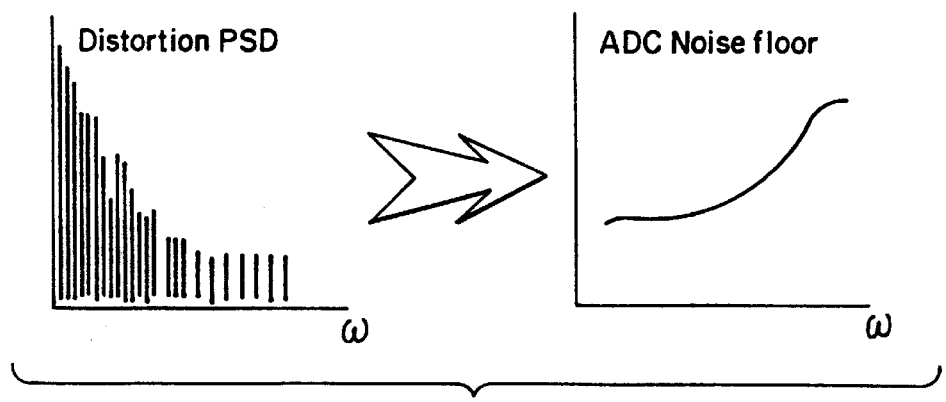
FIGS. 8A and 8B are graphs of the effect of PSD of the distortion components of the PSD of the converter noise floor.
Figure 8B:
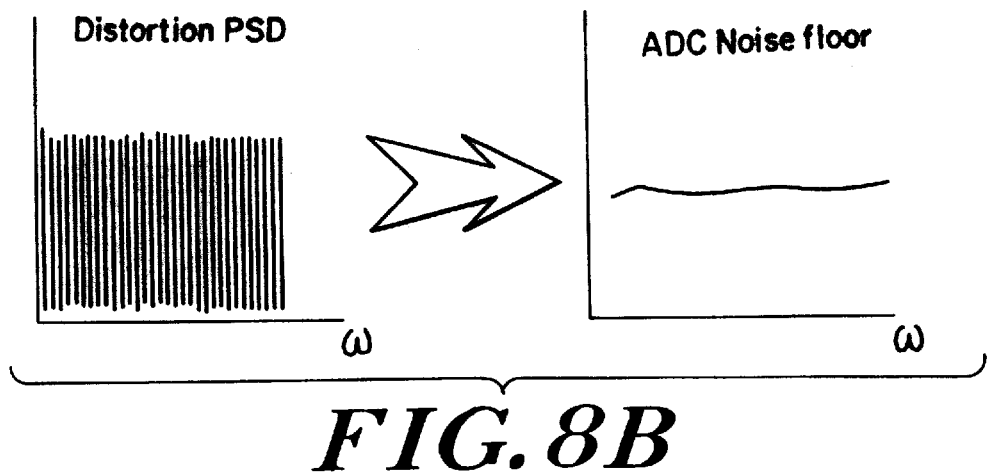

The main shortcoming of the aforementioned techniques is the degraded performance that they exhibit in the presence of out-of-band signals. These signals cannot be eliminated without complicating the design of the associated anti-aliasing filter. The degradation in performance can be understood by noting that the noise floor in these techniques results from convolving the spectra of the distortion with the spectra of the swapping sequence. If the strong distortion components are confined to low frequencies, then the convolution results in a noise floor that is concentrated around half the sampling frequency, as illustrated in the graph of FIG. 8A. However, if the distortion components are equally weighted at low and high frequencies, then the convolution results in a noise floor that is not shaped, but rather a noise floor that is white, as shown in FIG. 8B. This inevitably results in a rise in the in-band noise floor, and hence degrades the SNDR performance.

Figure 9A:
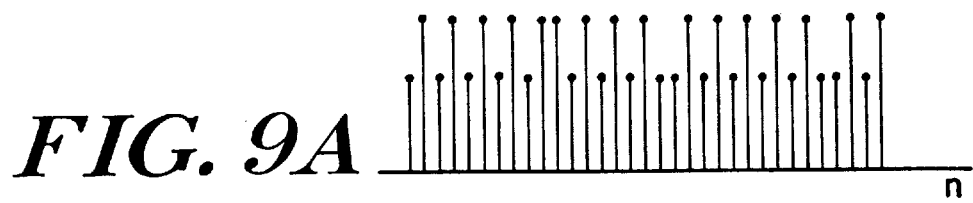
FIGS. 9A–9C are graphs of exemplary converter outputs with DC input.
Figure 9B:
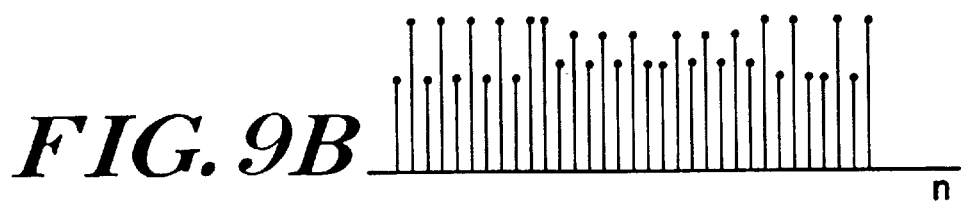
Figure 9C:
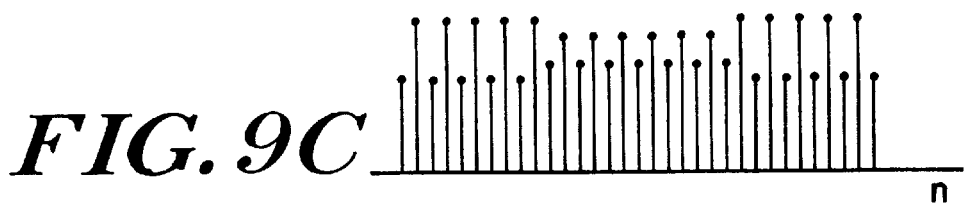

Additional degrees of freedom in the design can be obtained by using different swapping sequences for each stage. The output of a converter with a DC input is shown in FIGS. 9A and 9B, illustrating the effect of swapping the first two stages in the pipeline with the same random sequence and two independent random sequences respectively. The use of two random sequences amplitude modulates the error in the output of the converter, in addition to the phase modulation, which can also be seen in FIG. 9A. The phase modulation whitens the in-band noise floor, but introduces errors at each phase transition, since the average value of the output deviates from the desired value at these points. A more effective approach which eliminates these phase transitions, while relying on the amplitude modulation to whiten the in-band distortion, can be realized by using a nonrandom sequence $s[n]=(-1)^n$ for the first stage, and a random sequence for the remaining stages. FIG. 9C illustrates the effect of this technique on the output of the converter with a DC input. This method results in a significant improvement in the SNDR of the converter. Moreover, this technique is robust in the presence of out-of-band signals, and does not exhibit a rise in the noise floor.

Figure 10:
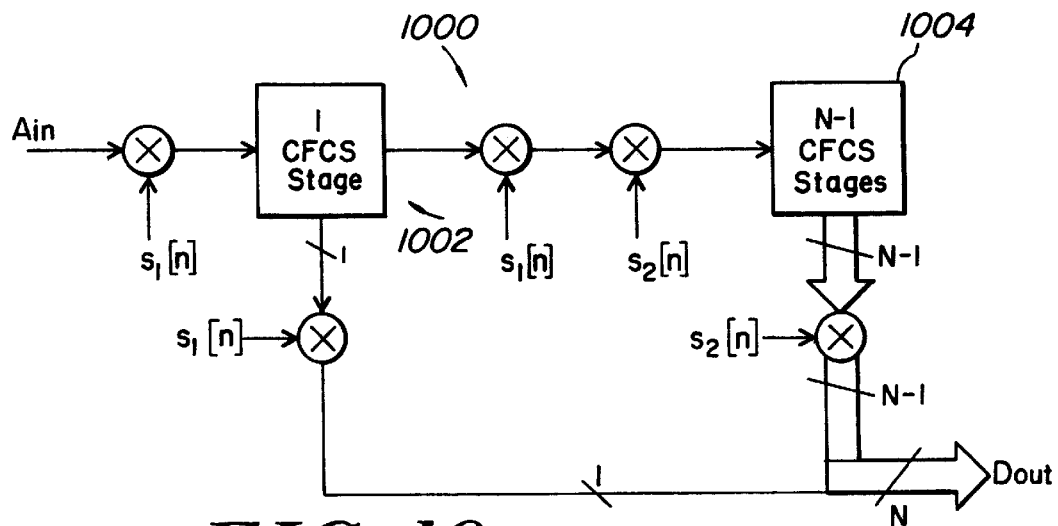
FIG. 10 is a functional block diagram of a converter circuit having a first stage CFCS.

An exemplary implementation of this approach is shown in FIG. 10. FIG. 10 is a functional block diagram of a converter circuit 1000 having a first stage CFCS 1002 which is swapped by the sequence $s_1[n]=(-1)^n$, and the remaining stages 1004 are swapped simultaneously using the sequence $s_2[n]$. The implementation of the analog and digital multipliers is again simple. Extending the aforementioned concept to more than two sequences does not result in a notable improvement in performance.

The extension of the mismatch shaping to multi-bit/stage pipeline converters is quite straightforward. The CFCS is employed here again because it smoothes out the converter transfer characteristic and renders the mismatch shaping more effective. Any one of the methods including dynamic element matching (DEM) based on random selection, individual level averaging, and data-weighted averaging (DWA) can be used. It appears the DWA is most effective for low oversampling ratio applications.

Figure 11:
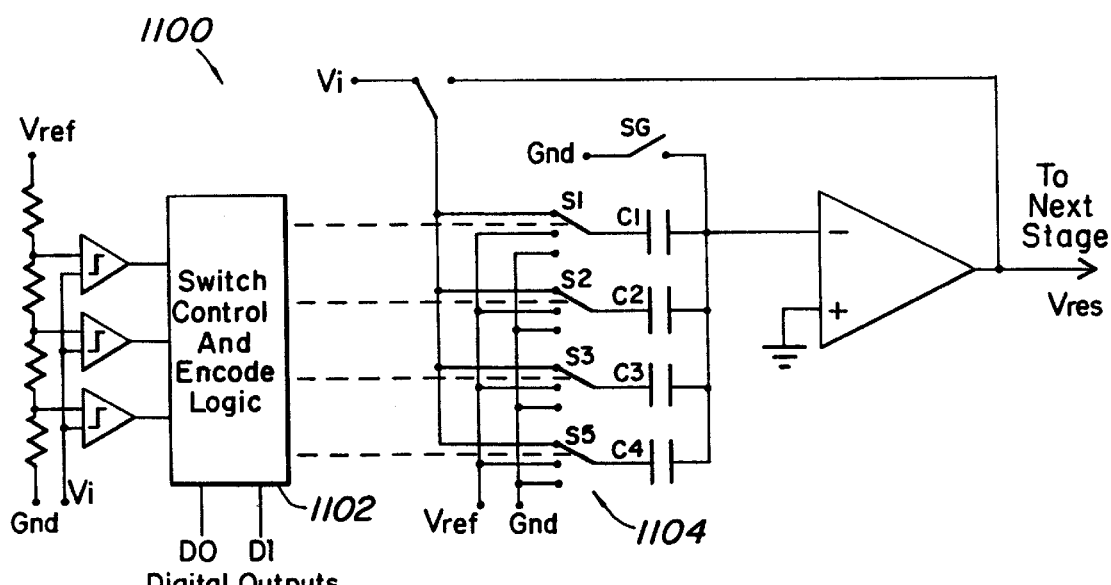
FIG. 11 is a schematic diagram of a first stage of a 2-bit/stage A/D pipeline converter with CFCS and mismatch shaping in accordance with the invention.

FIG. 11 is a schematic diagram of a first stage 1100 of a 2-bit/stage A/D pipeline converter with CFCS and mismatch shaping. For simplicity of discussion, the input range of the converter is 0 to $V_{REF}$, instead of $-V_{REF}$ to $V_{REF}$ in the 1-bit/stage example.

In the normal operation of CFCS, $C_1$, $C_2$, $C_3$, or $C_4$ is selected as the feedback capacitor if the data provided to logic unit 1102 is 00, 01, 10, or 11, respectively. In order to accommodate DWA in conjunction with CFCS, the roles of $C_1$ through $C_4$ are rotated via switches S1–S4 (1104) in a manner where they are exercised uniformly. For example, if the current data is 10, $C_1$ and $C_2$ are connected to $V_{REF}$ (exercised) and $C_3$ acts as the feedback during the amplification phase. On the next sample, $C_3$, $C_4$, $C_1$, and $C_2$ assume the role of $C_1$, $C_2$, $C_3$, and $C_4$, respectively. As a consequence, if the next data is 11, $C_3$, $C_4$, $C_1$ are connected to $V_{REF}$, and $C_2$ becomes the feedback capacitor. Now that $C_1$ through $C_4$, and then $C_1$ have been exercised, $C_2$ assumes the role of $C_1$, etc., and the process continues. The result of this is shaping of integral non-linearity of the converter out to high frequencies. Subsequent digital low-pass filtering removes the high frequency error.

The technique described herein removes the drawbacks of conventional systems, and it offers some additional advantages. Compared with a standard pipeline converter, the invention trades sampling rate for increased accuracy. The reduction in the sampling rate is the result of oversampling and subsequent digital low-pass filtering and decimation. This method yields superior kT/C noise and lower power consumption compared to other techniques which also improve accuracy at the cost of sampling rate. One difference is that the reduction in the sampling rate in the previous techniques does not provide oversampling. These techniques try to remove error on a sample-by-sample basis, hence there is straight reduction of sampling rate without oversampling. For this reason, there is no reduction of kT/C noise. In fact, these techniques contribute net increase of kT/C noise due to many additional sampling operations each of which adds kT/C noise. Compared with delta-sigma converters with mismatch shaping, the technique described herein can achieve much lower oversampling ratio with less complicated circuitry and lower power consumption. Unlike delta-sigma converters, the invention does not store state-variables on capacitors, and consequently it can be multiplexed in a straightforward manner.

Although the present invention has been shown and described with respect to several preferred embodiments thereof, various changes, omissions and additions to the form and detail thereof, may be made therein, without departing from the spirit and scope of the invention.

What is claimed is:

1. An analog-to-digital converter comprising:

an input that samples an analog input signal;

first means for multiplying said sampled analog input signal by a sequence including −1 and 1;

a conversion unit which converts said analog input signal into a monotonic digital output signal; and second means for multiplying said digital output signal by said sequence of −1 and 1 in phase with said first means to produce a mismatch shaped digital output signal.

2. The converter of claim 1 further comprising a low pass filter which filters said mismatch shaped digital output signal.

3. The converter of claim 1 further comprising at least one subsequent stage, said subsequent stage comprising:

an input that receives a portion of said analog input signal from a previous stage;

third means for multiplying said portion of said analog input signal by a second sequence including −1 and 1;

a second conversion unit which converts said portion of said analog input signal into a second monotonic digital output signal; and fourth means for multiplying said digital output signal by said second sequence of −1 and 1 in phase with said third means to produce a second mismatch shaped digital output signal.

4. The converter of claim 3, wherein said subsequent stages comprise a pipelined analog-to-digital converter.

5. The converter of claim 1, wherein said pipelined analog-to-digital converter is oversampled.

6. The converter of claim 1, wherein said conversion unit comprises a commutative feedback capacitor pipeline converter.

7. The converter of claim 1, wherein said sequence comprises a random sequence of −1 and 1.

8. The converter of claim 1, wherein said sequence comprises a sequence defined by $(-1)^n$.

9. The converter of claim 1, wherein said first and second means comprise multipliers.

10. The converter of claim 1, wherein said first means comprises means for swapping the polarity of fully differential inputs to said conversion unit.

11. A method of analog-to-digital conversion comprising:

sampling an analog input signal;

multiplying said sampled analog input signal by a sequence including −1 and 1;

converting said analog input signal into a monotonic digital output signal; and multiplying in phase said digital output signal by said sequence of −1 and 1 to produce a mismatch shaped digital output signal.

12. The method of claim 11 further comprising low pass filtering said mismatch shaped digital output signal.

13. The method of claim 11 further comprising subsequent signal processing including:

receiving a portion of said analog input signal;

multiplying said portion of said analog input signal by a second sequence including −1 and 1;

converting said portion of said analog input signal into a second monotonic digital output signal; and multiplying in phase said digital output signal by said second sequence of −1 and 1 to produce a second mismatch shaped digital output signal.

14. The method of claim 13 comprising a pipelined analog-to-digital converter.

15. The method of claim 11, wherein said pipelined analog-to-digital converter is oversampled.

16. The method of claim 11, wherein said conversion unit comprises a commutative feedback capacitor pipeline converter.

17. The method of claim 11, wherein said sequence comprises a random sequence of −1 and 1.

18. The method of claim 11, wherein said sequence comprises a sequence defined by $(-1)^n$.

19. The method of claim 11, wherein said first and second means comprise multipliers.

20. The method of claim 11, wherein said step of multiplying said sampling phases comprises swapping the polarity of fully differential inputs.

* * * * *